United States Patent
Macaluso

(10) Patent No.: US 7,319,353 B2
(45) Date of Patent: Jan. 15, 2008

(54) NON-LATCHING ENVELOPING CURVES GENERATOR

(75) Inventor: Steven M. Macaluso, Scarborough, ME (US)

(73) Assignee: Fairchild Semiconductor Co., South Portland, ME (US)

( * ) Notice: Subject to any disclaimer, the term of this patent is extended or adjusted under 35 U.S.C. 154(b) by 181 days.

(21) Appl. No.: 11/226,031

(22) Filed: Sep. 14, 2005

(65) Prior Publication Data

US 2007/0057713 A1    Mar. 15, 2007

(51) Int. Cl.
*H03K 3/356* (2006.01)
(52) U.S. Cl. .................... 327/199; 327/208; 327/209
(58) Field of Classification Search ........ 327/208–210, 327/199, 222, 214–215, 218; 326/26–27
See application file for complete search history.

(56) References Cited

U.S. PATENT DOCUMENTS

| | | | |
|---|---|---|---|
| 5,467,038 A * | 11/1995 | Motley et al. | 327/185 |
| 5,751,176 A * | 5/1998 | Sohn et al. | 327/295 |
| 6,208,186 B1 | 3/2001 | Nair | |
| 6,489,810 B2 | 12/2002 | Ferrant | |
| 6,570,406 B2 | 5/2003 | Tang et al. | |
| 6,838,920 B1 | 1/2005 | Pradhan | |

* cited by examiner

*Primary Examiner*—Dinh T. Le
(74) *Attorney, Agent, or Firm*—Cesari & McKenna, LLP

(57) ABSTRACT

An enveloping curves generator is disclosed that guarantees that one curve will envelop or overlap another when both are traversing from one logic level to another, and where the other overlaps the first when both traversing the other direction. In one case, a steering FET controlled by an input signal drives a first output high via a circuit. That first output going high, after a delay, drives a second output high. When the input goes low, a second steering FET controlled by the input signal drives the second output low. That second output going low, after a delay, drives the first output low. No latching is provided in the present invention.

8 Claims, 6 Drawing Sheets

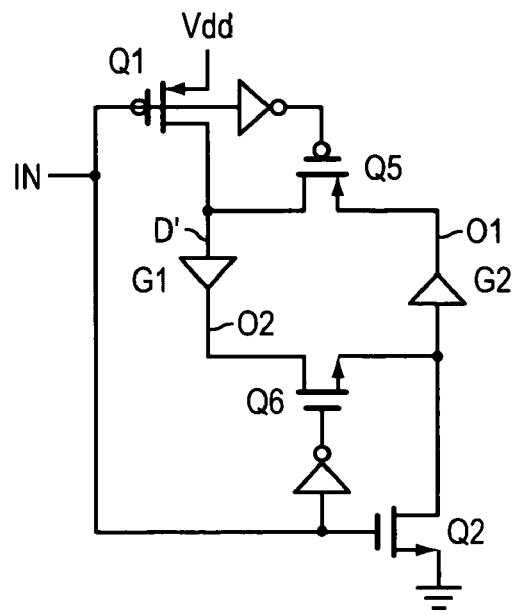
FIG. 7A
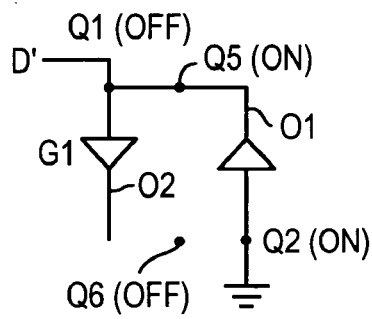
FIG. 7B
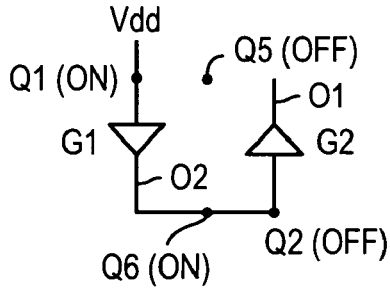
FIG. 7C
FIG. 7D
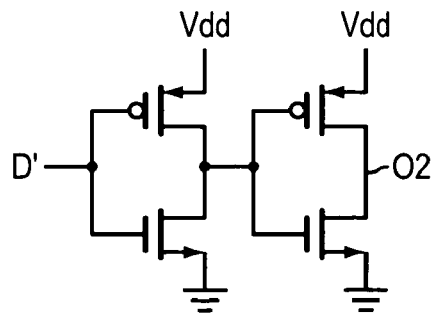
FIG. 7E

NON-LATCHING ENVELOPING CURVES GENERATOR

CROSS REFERENCE TO OTHER PATENTS

The present application is related to U.S. Pat. No. 6,838,920 B1 that issued Jan. 4, 2005. This issued patent is commonly owned with the present application, and this patent is hereby incorporated herein by reference.

BACKGROUND OF THE INVENTION

1. Field of the Invention

The present invention relates to signal generation, and more particularly to generation of signals with profiles or curves guaranteed to envelop or overlap other signals or curves, even when variations of chip processing and operating environments are considered.

2. Background Information

One problem, found in many circuits where transistors are stacked, occurs when one transistor is turning off and the other is turning on. If there is an overlap where both are on, even briefly, relatively large current spikes may occur. These spikes may cause circuit malfunctions.

In many applications there is a continuing need for circuit designs where "break before make" or, possibly, "make before break" operations are required. Ensuring such a sequential operation can relieve the spiking problem and such is an objective of the present invention.

U.S. Pat. No. 6,838,920 B1 ('920), mentioned above, provides a circuit that ensures these sequential operations. This circuit may be used to advantage in many applications. Prior art FIGS. 1 and 2 are taken directly from FIGS. 1 and 2 in '920 patent. An operative feature of the '920 patent is latching that is prominently discussed and claimed therein.

Referring to FIGS. 1 and 2 of the present application, it can be seen that when IN goes high, Q2 turns on and Q1 turns off. Q1 and Q2 are steering FET's that direct the input signal to operate the circuit as discussed. Q1 operates to hold point A high, but Q1 turning off has no effect since the inverter I3 also holds point A high. Point A is also the input to inverter I1, so O2, the output of I1 remains low. Meanwhile, point B, which was high, is driven low by Q2 turning on as IN goes high. Point B is held high by I2 (since O2 remains low), but Q2 is designed to overcome I2's drive and force point B low. When point B goes low, O1 is driven high by I4 with item 20 indicating the initial source of O1 going high is IN going high. When O1 goes high, the latch on point A via I3 is released. Thus, point A goes low and O2 goes high via I1 as indicated by item 22. The feed back around the loops of inverters ensures that O2 goes high well after (by two gate delays at least) and in response to O1 going high. The arrows in FIG. 2 show the imposed sequence of signals, the enveloping is evident.

Correspondingly, when IN goes low, Q1 turns on and Q2 turns off. Q1 drives point A high, but Point B remains low regardless of Q2, since the latching I2 drives B low. Here Q1 overcomes the I3 latch that was driving point A low. Then, in sequence, O2 goes low 24 driving point B high, which drives O1 low 26 via I4. I4, in turn, drives point A high which latches point O1 high. These operations are well shown in the traces shown in FIG. 2.

In each of the above operations, please note that Q2 drives point B low by overcoming the drive of I2; and that Q1 drives point A high overcoming the drive of I3. This contention serves to slow the circuit frequency of operation, affects low voltage operation, dissipates power, and impairs the wave forms/duty cycle of the resulting signals. The present invention is directed to these limitations of the circuit in FIG. 1 and other known prior art circuits, while providing their and other advantages.

SUMMARY OF THE INVENTION

In view of the foregoing background discussion, the present invention provides a non-latching enveloping curves generator and method, where an input signal, via steering transistors, devices or circuits causes a first output signal to change logic states, and that change causes a second output to change logic states. The net effect is that, in response to the input signal changing from one logic state to a second, the first logic output changes levels before the second. When the input signal changes back, the second logic output changes levels before the first. The effect is that one output curve envelops the other.

In one preferred embodiment, the steering devices are a PMOS and an NMOS transistor, and the generator includes inverters connected in series. In this circuit when the second steering FET is turned off, the first steering FET is turned on. This places a high at the input of a first inverter. The output of that inverter is a first output that travels low. That low travels through a second inverter whose high output travels through a first on switch to a third inverter. This third inverter's output is a second output that always goes low after the first output goes low.

When the first steering FET is turned off, the second steering FET is turned on. This places a low at the input of the third inverter. The output of that inverter is the second output that travels high. That high travels through a fourth inverter whose low output travels through a second on switch to the input of the first inverter. The output of the first inverter is the first output and it is driven high. This first output always goes high after the second output goes high. The first switch is turned off in this case, and the second switch is turned off in the first case, described above.

In other preferred embodiments, non-inverters and combinations of inverters and non-inverters may be used to advantage.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which:

FIG. 3A, FIGS. 4A, 4B, 5A, 5B, and 6A and 6B are timing diagrams comparing prior art and the present invention, FIGS. 7A-7E illustrate another preferred embodiment.

DETAILED DESCRIPTION OF AN ILLUSTRATIVE EMBODIMENT

Figure 3A:
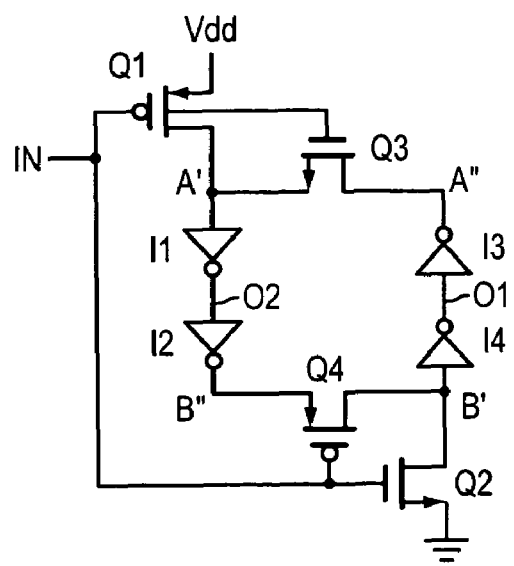
FIG. 3A is a circuit schematic preferred embodiment of the present invention.
Figure 3B:
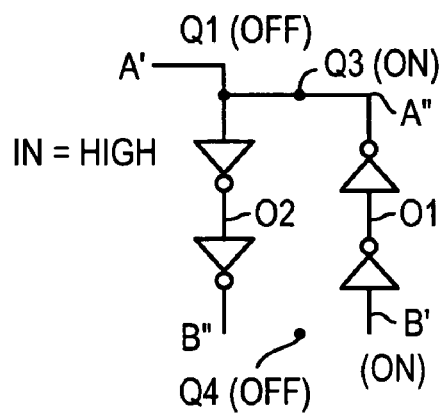
FIGS. 3B-3F are detailed schematic and timing diagrams for the circuit

FIG. 3A illustrates an embodiment of the present invention. The IN input signal is connected to the gates of two steering devices, a first steering FET, Q1 and a second steering FET, Q2. In this instance, P and N type MOSFET's are illustrated, but other transistor devices or circuits may be used to accomplish the same function, as would be known to those skilled in the art. When IN is high, FIG. 3B illustrates the status of the circuit. Here, Q1 is off and Q2 is on, and second node point B' is low and O1 is driven high via second circuit inverter I4. Q3 is a second switch functionally connects the second circuit output O1, via I3, to the first node A.' I4 drives I3 that drives point A" low. Q3 is on so first node point A' is low and first circuit I1 drives O2 high. I2 drives point B" high, but a first switch, Q4, functionally connected, via I2, from the first circuit I1 output and the second node B', is off so there is no latching of point B' via Q4.

Figure 1:
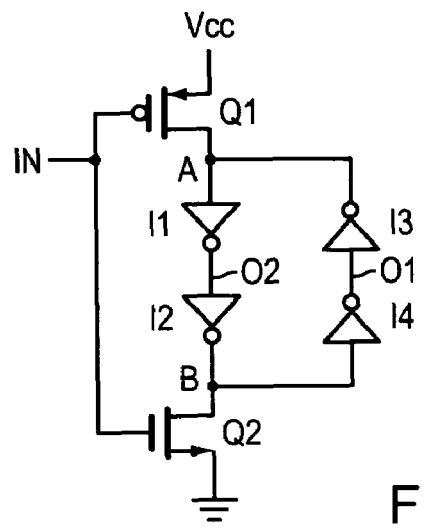
FIG. 1 is a prior art circuit schematic.
Figure 3C:
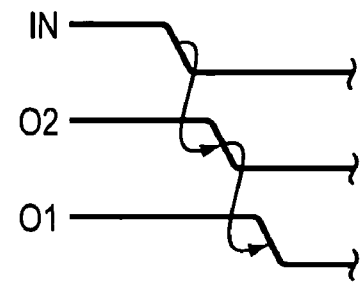
Figure 3D:
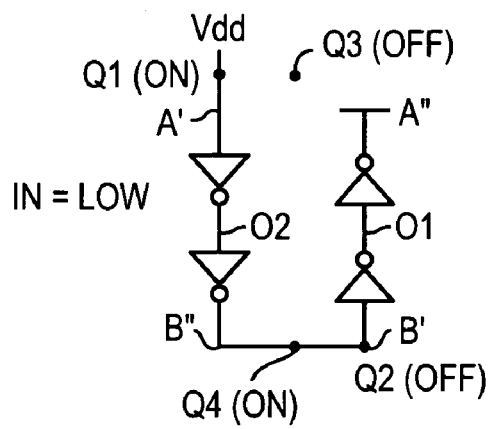

FIG. 3C illustrates the timing and operations, as the schematic of FIG. 3B yields to the schematic of FIG. 3D, when IN goes low. Referencing FIGS. 3C and 3D, when IN goes low Q1 turns on, Q2 turns off, Q3 turns off and Q4 turns on. At this point the circuit of FIG. 3D applies. Point A' is driven high via Q1, and since Q3 is off, Q1 does not have to overcome the drive of I3 as in FIG. 1 described above. O2 goes low 30 via I1 driving point B" high via I2. B" high drives point B' high via Q4, and I4 drives O1 low 32. Notice the O1 low drives A" high, but, since Q3 is off, A" high does not connect to A' and the circuit is not latched.

Figure 3E:
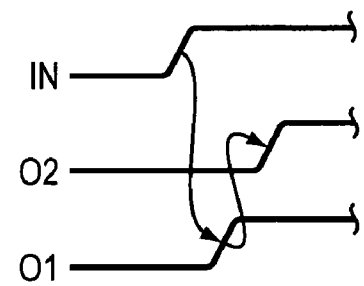

When IN is low, the circuit in FIG. 3D applies, and as IN goes high the timing signals of FIG. 3E illustrate the timing as the schematic of FIG. 3D yields to that of FIG. 3B. When IN goes high, Q1 turns off, Q2 turns on, Q3 turns on, and Q4 turns off, and the circuit of FIG. 3B applies. Point B' is driven low via Q2, and since Q4 is off, Q2 does not have to overcome the latching drive of I2 as in FIG. 1. B' low drives O1 high 34 via I4, that in turn drives A" low via I3. A" low drives A' low via the on Q3, and O2 high 36 via I1. Note that I2 drives point B" low, but that low does not latch since Q4 is off.

Figure 3F:
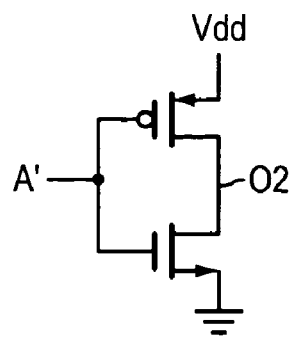

FIG. 3F illustrates an embodiment of one inverter, in this case I1. The gates of a PMOS Q10 and the NMOS Q12 are tied together to A', and the drains of each are tied together to form O2. The source of Q10 is tied to Vdd and the source of Q12 is tied to ground. This arrangement is a well known push/pull stacking of transistors to form an inverter. Other circuit devices and components may be used as is known to those skilled in the art. Also, the present embodiments shown in FIGS. 3A-3F illustrate inverters or inverting circuits, but non-inverting circuits (herein defined with one or more inputs) may be used or even combinations of inverters and non-inverters may be used. Also, other circuits may be used with the inverters/non-inverters in other applications. In addition, resistors may be added to the circuit, as in the incorporated patent mentioned above, to provide circuit delays if desired.

Figure 2:
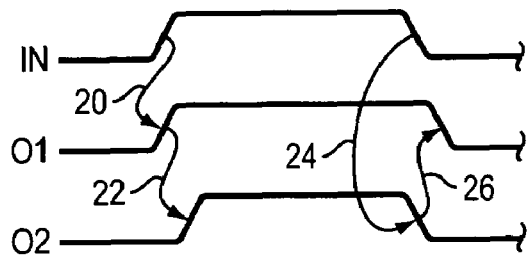
FIG. 2 is a timing diagram of the operation of the circuit in FIG. 1.

Notice that the timing diagrams of FIG. 3C and FIG. 3E demonstrate the same enveloping or overlapping of the outputs O1 and O2 as illustrated in FIG. 2, but without the steering transistors, Q1 and Q2, having to overcome output drives of the inverters as described above. This fact leads to advantages that are evident in FIGS. 4A, 5A, and 6A.

Figure 4A:
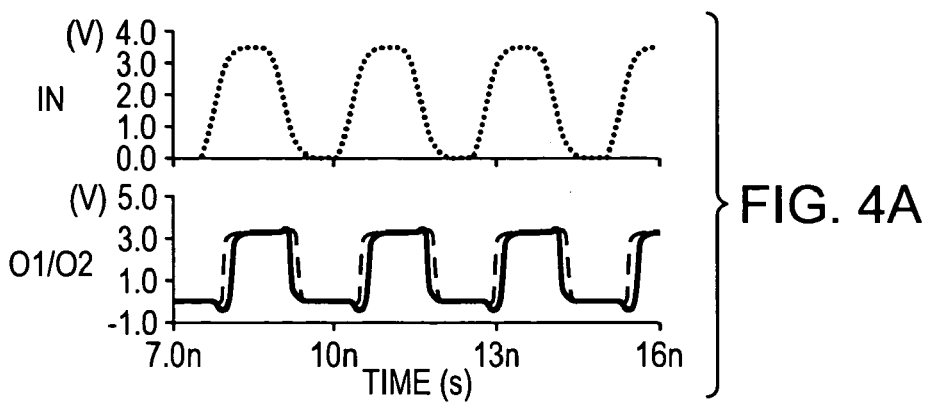
Figure 4B:
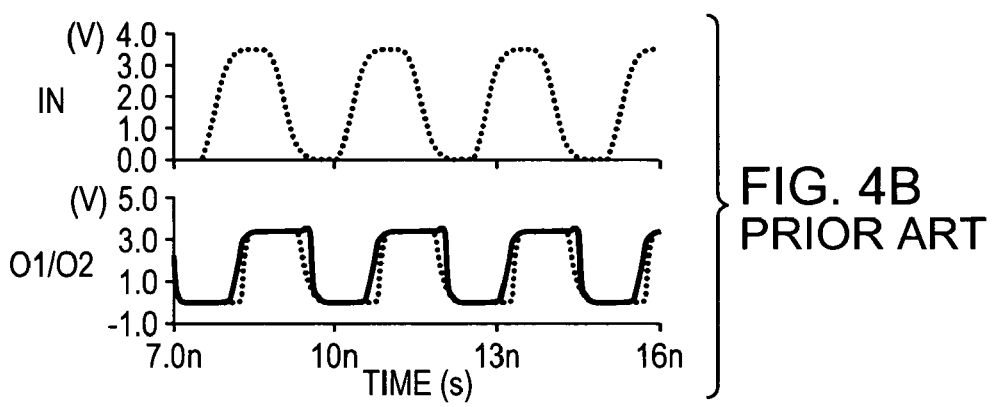
Figure 5A:
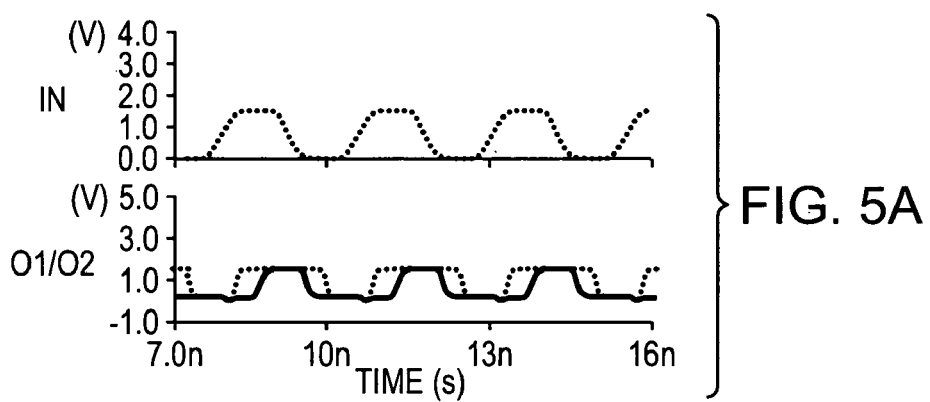
Figure 5B:
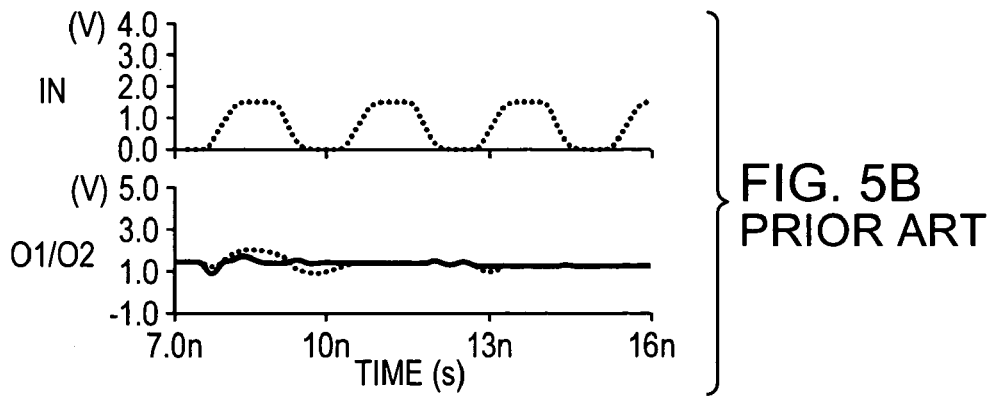
Figure 6A:
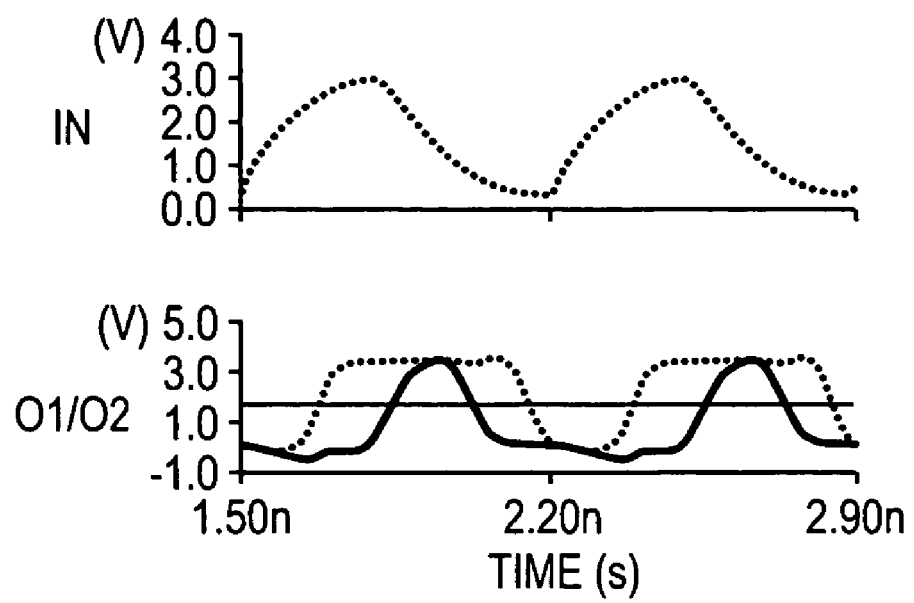

FIGS. 4A, 4B, 5A, 5B, 6A and 6B are measurements made at 25° C. and similar size devices are used in each circuit. FIGS. 4A, 5A, and 6A are for the inventive circuit of FIG. 3A, and FIGS. 4B, 5B and 6B are for the prior art circuit of FIG. 1. In each case, the waveforms showing a double waveform, one trace solid and one trace dotted, are the enveloping curves O1 and O2, as discussed herein.

The waveforms in FIGS. 4A and 4B are at a Vdd supply voltage of 3.5V. This measurement was to compare supply currents. The current drawn from the Vdd supply for operation in FIG. 4A (new) was about 0.5 ma, while the current from Vdd in FIG. 4B (prior art) was about 2.0 ma. The inventive circuit dissipates less power than does the prior art circuit.

The Vdd supply voltage, for the waveforms in FIGS. 5A and 5B and FIGS. 6A and 6B, is 1.5V. The respective currents drawn from Vdd for FIG. 5A (new) is 0.16 ma and for FIG. 5B (prior art) is 0.45 ma. The respective currents drawn from Vdd for FIG. 6A (new) is 1.6 ma and for FIG. 6B (prior art) is 5.3 ma. It is noted that in each case the new circuit drew less current and thus dissipated less power than the prior art circuit. Again these comparisons are with similar device sizes at room temperature.

Referencing FIGS. 4A (new) and 4B (prior art) it is evident that the outputs, O1/O2, are sharper and better defined in FIG. 4A than in FIG. 4B.

Comparing the traces in FIG. 5A (new) with those in FIG. 5B (prior art), there is a defined output, O1/O2, in FIG. 5A, while there is some un-usable noise-like response in FIG. 5B.

Figure 6B:
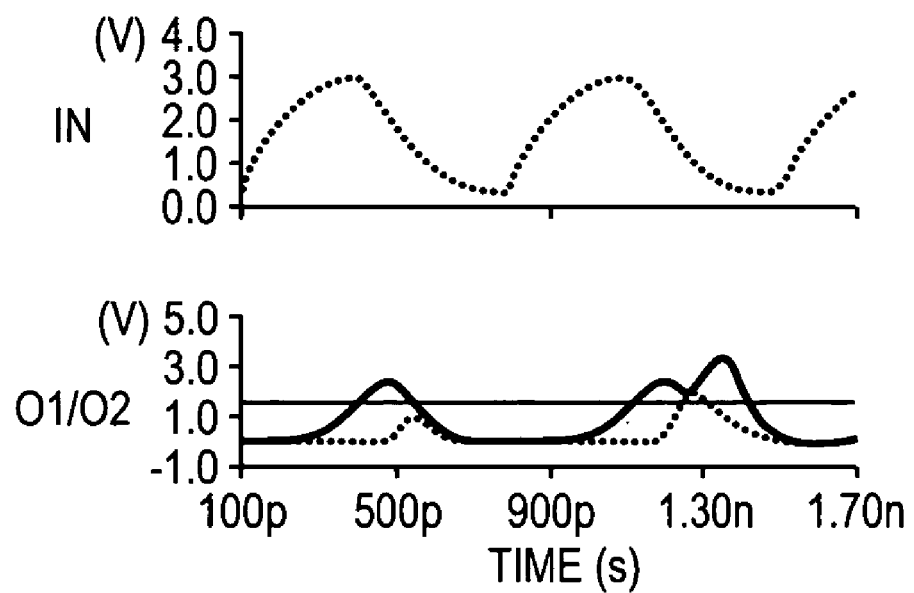

Comparing the traces in FIG. 6A (new) with those in FIG. 6B (prior art), each with a high frequency input of about 1.4 GHz, it is evident that the new circuit provides a useable output of both O1 and O2 while the prior art circuit outputs are unusable.

FIG. 7A illustrates another embodiment of the present invention. Here, there are two non-inverting circuits, G1 and G2, arranged back to back with intervening switches Q5 and Q6. When IN is high, Q1 and Q4 are off, while Q2 and Q3 are on. FIG. 7B illustrates this case. O1 and O2 are both high. The timing sequence is enveloping, as before, for FIG. 3A, except there is only one gate delay between the outputs. Specifically, when Q2 turns on, G2 drives O1 low, which, in turn, drives O2 low via G1.

When IN goes low, Q1 and Q4 turn on, and Q2 and Q3 are off. FIG. 7C illustrates this condition. The sequence is that Q1 on, drives O2 high via G1. O2 high drives O2 high via G2.

FIG. 7D illustrates the same enveloping operating of the circuit of FIG. 7A.

FIG. 7E illustrates one example of how a non-inverting circuit, comprised of series inverters, may be used for G1 and G2. Of course, other circuits and combinations of circuits may used to advantage.

Figure 8A:
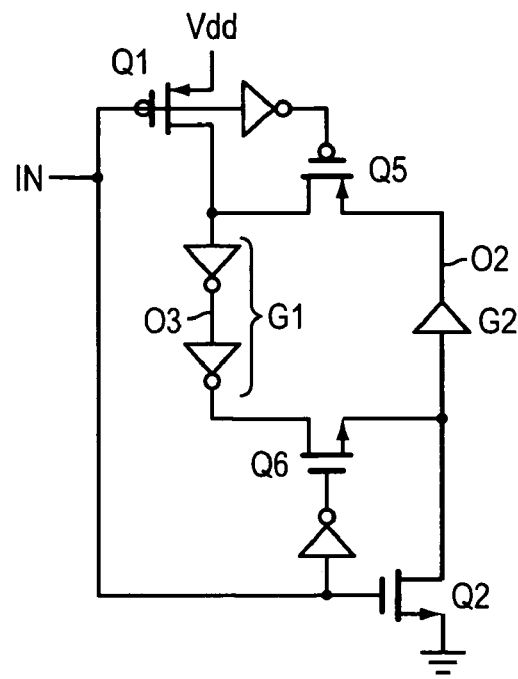
FIGS. 8A, 8B and 8C illustrate yet other preferred embodiments and timing.
Figure 8B:
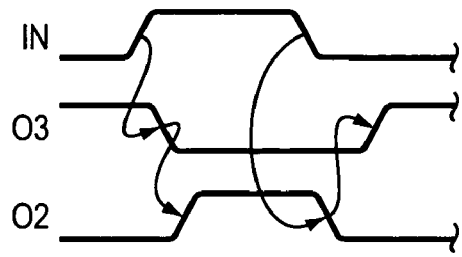
Figure 8C:
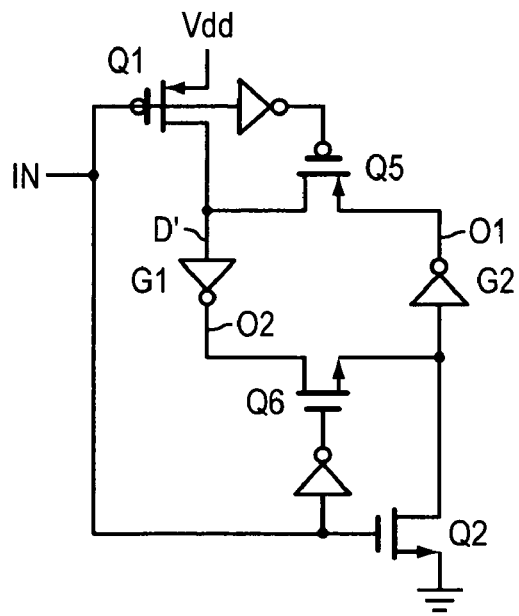

FIG. 8A illustrates another embodiment, except one non-inverting gate G1 is replaced by two inverters in series. In this case, the polarity of one output may be reversed. This timing is shown in FIG. 8B, where the enveloping remains but one signal is inverted with respect to the other output. FIG. 8C illustrates another embodiment where inverters are used.

Although the preferred embodiments are illustrated using MOSFET's herein, other devices may be used as known to those skilled in the art. Some examples of such other devices include: bipolar transistors, insulated gate bipolar transistors, hybrid forms of transistors, and combinations thereof. In addition, as known to those skilled in the art, the inverter and non-inverting gates may be comprised of different arrangements of circuit components, e.g. cascade and totem pole type circuits, among others.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. An enveloping curves generator comprising:
a first steering device and a second steering device, where an input signal is connected to a control input on both steering devices, wherein the control input determines the on and off state of the steering devices, wherein the first steering device controls the voltage at a first node when the input signal is in the low state, and wherein the second steering device controls the voltage at a second node when the input signal is in the high state;
a first circuit having an output and an input connected to the first node;
a second circuit having an output and an input connected to the second node;
a first switch functionally disposed between the first circuit output and the second node;
a second switch functionally disposed between the second circuit output and the first node;
wherein when the input is in the low state, the first switch is deactivated, and the second switch is activated making a connection from the second circuit output to the first node, and when the input is in the high state, the second switch is deactivated, and the first switch is activated making a connection from the first circuit output to the second node; and
when the input traverses from the high state to the low state, the output of the first circuit changes before the output of the second circuit, and then when the input traverses from the low state to the high state, the output of the second circuit changes before the output of the first circuit.

2. The generator of claim 1 wherein the first circuit comprises two inverters connected in series.

3. The generator of claim 2 wherein the second circuit comprises two inverters connected in series, and where the connections between the inverters are defined as the outputs.

4. The generator of claim 1 wherein the steering devices and the first and second switches are MOS transistors.

5. The generator of claim 1 wherein the first and second circuits are inverters where each inverter comprises a PMOS and an NMOS with their drains connected together forming an output, and their gates connected forming an input, and where the source of the PMOS is connected to a positive power rail and the source of the NMOS is connected to ground.

6. The generator of claim 1 wherein the first and second circuits are non-inverting circuits where each circuit comprises two inverters arranged in series.

7. A non-latching enveloping curves generator comprising:
a first PMOS steering transistor and a second NMOS steering transistor with their gates connected to an input signal that determines the on and off state of the steering transistors, wherein the first steering PMOS steering transistor controls the voltage at a first node when the input signal is in the low state, and wherein the second NMOS steering transistor controls the voltage at a second node when the input signal is in the high state;
first and second inverters connected in series defining a first input of the first inverter and a first output from the second inverter, the first input connected to the first node;
third and fourth inverters connected in series defining a second input of the third inverter and a second output from the fourth inverter, the second input connected to the second node;
a first transistor switch functionally disposed between the first output and the second node;
a second transistor switch functionally disposed between the second output and the first node;
wherein when the input is in the low state, the first transistor switch is deactivated, and the second transistor switch is activated making a connection from the second output to the first node, and when the input is in the high state, the second transistor switch is deactivated, and the first transistor switch is activated making a connecting from the first output to the second node; and
when the input traverses from the high state to the low state, the first output changes before the second output, and then when the input traverses from the low state to the high state, the second output changes before the first output.

8. A method for generating enveloping curves comprising the steps of:
steering an input signal to control inputs on two steering devices, wherein the control input determines the on and off state of the steering devices, wherein the first steering device controls the voltage at a first node when the input signal is in the low state, and
wherein the second steering device controls the voltage at a second node when the input signal is in the high state;
connecting the input of a first circuit connected to the first node;
defining an output from the first circuit;
connecting the input of a second circuit to the second node;
defining an output from the second circuit;
wherein when the input is in the low state, making a connection from the second circuit output to the first node, and when the input is in the high state, making a connection from the first circuit output to the second node; and
when the input traverses from the high state to the low state, the output of the first circuit changes before the output of the second circuit, and then when the input traverses from the low state to the high state, the output of the second circuit changes before the output of the first circuit.

* * * * *

UNITED STATES PATENT AND TRADEMARK OFFICE
CERTIFICATE OF CORRECTION

PATENT NO. : 7,319,353 B2 Page 1 of 1
APPLICATION NO. : 11/226031
DATED : January 15, 2008
INVENTOR(S) : Steven M. Macaluso It is certified that error appears in the above-identified patent and that said Letters Patent is hereby corrected as shown below:

On the title page, item [73] should read

(73) Assignee: Fairchild Semiconductor Corporation, South Portland, ME (US)

Signed and Sealed this

Ninth Day of December, 2008

JON W. DUDAS
*Director of the United States Patent and Trademark Office*